(12) United States Patent
Dornseifer et al.

(10) Patent No.: US 8,941,417 B2
(45) Date of Patent: Jan. 27, 2015

(54) OUTPUT DRIVER FOR ENERGY RECOVERY FROM INDUCTOR BASED SENSOR

(71) Applicant: Texas Instruments Deutscland GmbH, Freising (DE)

(72) Inventors: Frank Dornseifer, Freising (DE); Bernard Wolfgang Ruck, Freising (DE); Erich Bayer, Thonhausen (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/780,702

(22) Filed: Feb. 28, 2013

(65) Prior Publication Data

US 2014/0240008 A1 Aug. 28, 2014

(51) Int. Cl.
*H03K 3/00* (2006.01)
*H03K 19/00* (2006.01)
(52) U.S. Cl.
CPC ..................................... *H03K 19/00* (2013.01)
USPC .......................................................... 327/110
(58) Field of Classification Search
USPC .............................. 326/82–85, 87–89, 91, 92; 327/108–112
See application file for complete search history.

(56) References Cited

U.S. PATENT DOCUMENTS

| 3,742,698 | A | * | 7/1973 | Naito | 368/156 |
|---|---|---|---|---|---|
| 4,540,899 | A | * | 9/1985 | Pelly | 327/110 |
| 5,936,439 | A | * | 8/1999 | Pollersbeck | 327/110 |
| 5,952,856 | A | * | 9/1999 | Horiguchi et al. | 327/110 |
| 6,262,620 | B1 | * | 7/2001 | Jenski et al. | 327/424 |
| 6,366,063 | B1 | * | 4/2002 | Sekii | 323/223 |
| 6,683,487 | B2 | * | 1/2004 | Takeuchi et al. | 327/423 |
| 7,576,533 | B2 | | 8/2009 | Bach et al. | |
| 8,847,631 | B2 | * | 9/2014 | Tao et al. | 327/108 |
| 2011/0228564 | A1 | * | 9/2011 | Uruno et al. | 363/17 |
| 2013/0265086 | A1 | * | 10/2013 | Chang et al. | 327/109 |
| 2013/0334987 | A1 | * | 12/2013 | Garg et al. | 318/116 |

* cited by examiner

*Primary Examiner* — William Hernandez
(74) *Attorney, Agent, or Firm* — John R. Pessetto; Frederick J. Telecky, Jr.

(57) ABSTRACT

A system for recovering energy from a sensor couples a battery to an inductive device in the sensor for a period of time, such that a current flows through the inductive device from the battery during the time period. The connections of the inductive device are then reversed for a second period of time. During the second time period, a current flow resulting from energy stored in the inductor is allowed to flow back to the battery, such that a portion of the energy from the inductor recharges the battery during the second period of time.

2 Claims, 6 Drawing Sheets

OUTPUT DRIVER FOR ENERGY RECOVERY FROM INDUCTOR BASED SENSOR

FIELD OF THE INVENTION

This invention generally relates to battery powered sensor modules, and in particular driver circuits for an inductive element in a sensor module.

BACKGROUND OF THE INVENTION

Battery powered sensors and utility meters are now commonplace. Battery powered meters and sensors may be designed to only be read by onsite inspection, or they may include a transmitter to allow transmission of sensed data to a remote location. Remote wireless sensor networks may include sensor nodes spread out over a home, office building, or factory to help with energy management, comfort enhancement, security, diagnostics, and other applications.

Battery life is a key consideration when implementing a wireless sensor network as many battery-operated sensors may be in inaccessible locations. Additionally, changing batteries in a large number of sensor nodes poses huge operational and environmental costs. Radio power of these wireless nodes is one source of battery drain. RF standards such as ZigBee are popular in low data rate, low power applications. ZigBee and other low power RF standards use MAC and PHY layers defined by IEEE 802.15.4. An amendment to 802.15.4, called 802.15.4e uses a duty-cycled MAC (media access control) to reduce radio power consumption.

Another source of battery drain for a sensor is the operation of the sensor itself, which typically must be activated at a high repetition rate. Some types of sensor device may use an inductive component to monitor a physical parameter. To perform measurement, a current is produced in the inductor of the sensor. This is normally done with a short voltage pulse applied to a primary inductor to induce a response in a secondary inductor that provides an indication of the physical parameter being sensed.

BRIEF DESCRIPTION OF THE DRAWINGS

Particular embodiments in accordance with the invention will now be described, by way of example only, and with reference to the accompanying drawings.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Embodiments of the invention provide an output driver that is able to recover energy from an inductor based sensor. An example inductor based sensor is a FMP (Fast Magnetic Pulse) Sensor that may be part of a system that is monitoring a physical parameter, such as water or gas flow, for example. A FMP sensor has a primary inductor and one or more secondary inductors that may be magnetically coupled to the primary inductor when a magnetic field is induced by the primary inductor. A sensor measurement may be done by producing a current in the primary inductor of the FMP, which in turn may induce a current in the one or more secondary inductors that are indicative of the physical parameter that is being sensed. In a typical FMP sensor, the current in the primary inductor may be produced by a short voltage pulse with a pulse width time (Tp) in a range of 8 ns-22 ns, for example. In previous sensor systems, the energy used to produce the short voltage pulse is dissipated. Embodiments of the invention provide circuitry to recover a significant portion of the energy used by the primary inductor in order to significantly extend the life of a battery that is used to power the sensor system.

In a FMP sensor, the secondary inductor(s) may be arranged in various physical configurations and magnetic coupling may be influenced by various configurations of metallic elements that may be mechanically moved in response to the physical parameter that is being sensed. For example, a movable vane may be responsive to air movement; a rotating element may be responsive to water or gas, for example, moving in a pipe, etc. An example FMP sensor is explained in more detail in U.S. Pat. No. 7,576,533, "Inductive Angular-Position Sensor" which is incorporated by reference herein.

Sensor applications are powered by a battery and it is necessary to have a very long battery life time, which requires the system to be energy efficient. Tradeoffs between area, system complexity, power consumption will be described herein. Energy recovering is an important technique to improve the efficiency of a sensor system. A zinc-alkaline or nickel-cadmium rechargeable battery, for example, may be used to provide power to a sensor system, and may be recharged by energy recovered from the sensor system.

Figure 1:
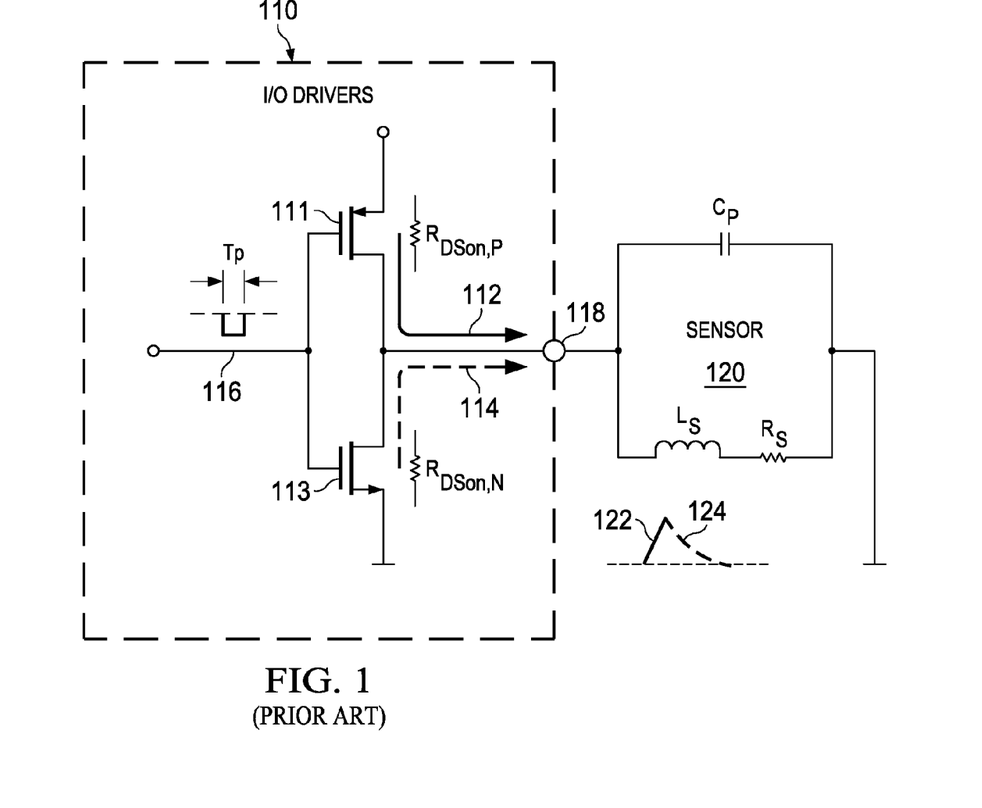
FIG. 1 is a schematic of a prior art sensor driver.

FIG. 1 is a schematic of a prior art sensor driver 110 connected to FMP sensor 120. A timing signal 116 controls the operation of driver 110. In this illustration, only the primary inductor Ls of FMP sensor 120 is shown, along with parasitic capacitance Cp and parasitic series resistance Rs. Inductor Ls and the parasitic components in combination present an impedance load to driver 110. One lead of sensor 120 is connected to output pin 118 of driver 110, while the other lead of sensor 120 is connected to ground. In this case, the driver provides a source of power to sensor 120. Alternatively, the other lead of sensor 120 may be connected to a power source and driver 110 then provides a ground connection to sensor 120.

Sensor 120 is activated by placing a signal pulse on control signal 116 that has a pulse width Tp. Initially, switch device 111 is turned off, switch device 113 is turned on, and no current is flowing in sensor 120. With the first edge of the voltage pulse, device 111 turns on and a current 112 starts to flow through the inductor. The current rises in an approximate linear manner, as illustrated at 122. For a good linearity, the pulse width Tp needs to be smaller than time constant (Tp<<Ls/Rdson). Energy is stored in the magnetic field of the inductor in response to current 112.

With the second edge of the voltage pulse on control signal 116, device 111 is turned off and device 113 is turned back on. Current 112 stops increasing as illustrated at 122; however, the magnet field of inductor Ls begins to collapse and produces a current 114 that decreases until it is back to zero when the magnetic field is completely collapsed as illustrated at 124. This energy is normally lost because there is no way to recover energy from the inductor when only one terminal is connected to the driver.

FIGS. 2-5 are schematics of sensor drivers that recover energy from an inductive component of a sensor. The basic idea is to use two pins to drive the inductor instead of one pin as in the prior art. During the control signal pulse, one pin of the inductor is connected to the supply voltage; the other is connected to ground. This way the inductor is charged. During a second period of time, the polarity of the two driver pins can be reversed after the control signal pulse to discharge the inductor and recover the stored energy in the coil and use it to recharge the battery.

In general, a sensor driver that may recover energy may have a control circuit that has an output for a first timing signal. A first driver circuit has a first output terminal for coupling to a first terminal of an inductive device and an input coupled to receive the timing signal, wherein the first driver circuit is configured to provide a low impedance from the first output terminal to a ground reference during a first time period and to provide a low impedance for current flowing from the first output terminal to a voltage supply line during a second time period. There is a second driver circuit that has a second output terminal for coupling to a second terminal of the inductive device and an input coupled to receive the timing signal, wherein the second driver circuit is configured to provide a low impedance from the voltage supply line to the second output terminal during the first time period and to provide a low impedance for current flowing from the ground reference to the second output terminal during the second time period.

Figure 2:
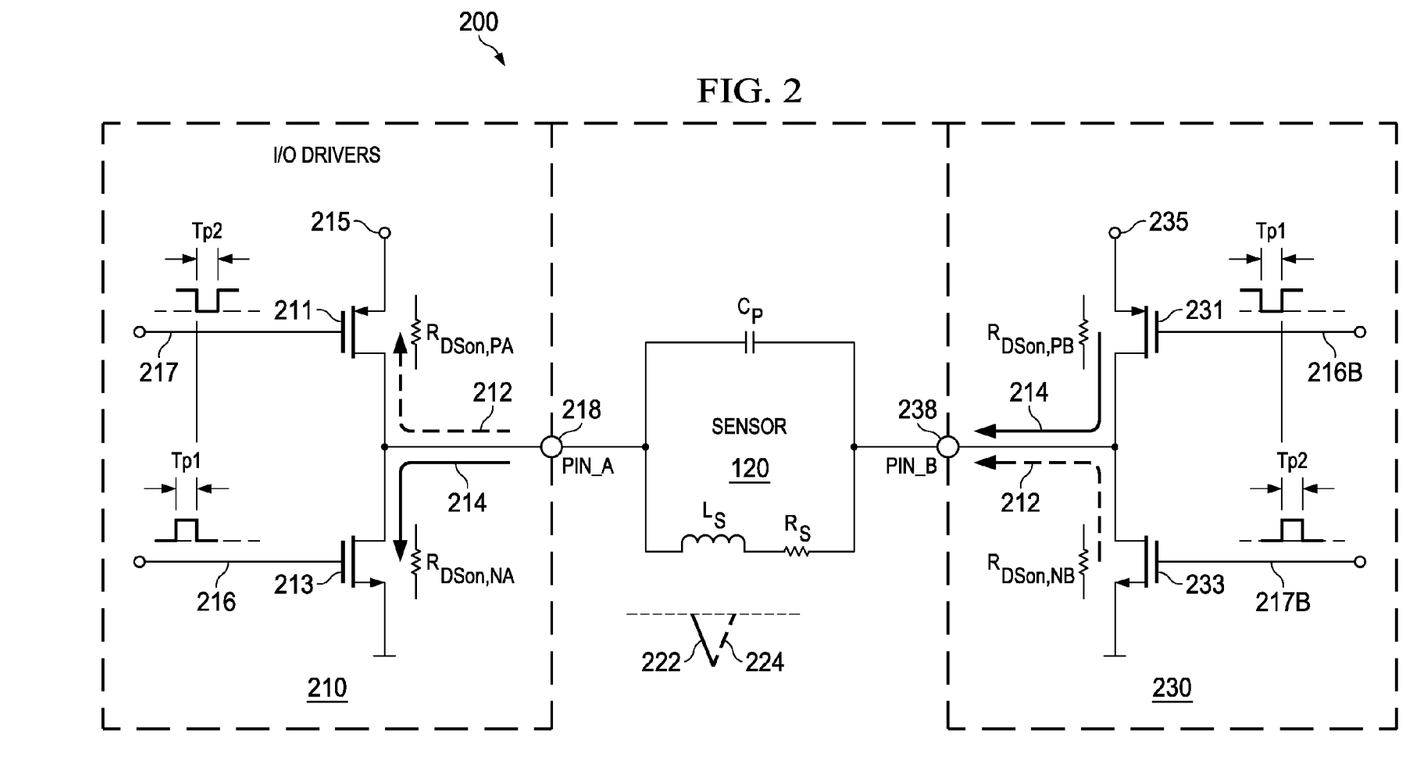
FIGS. 2-5 are schematics of sensor drivers that recover energy from an inductive component of a sensor.

In an embodiment illustrated in FIG. 2, switch devices are used on both pins for discharging the inductor. In this case, a precise control of the discharge time is required; otherwise the circuit would start to charge up again. A neutral state can be achieved by applying the same polarity on both pins.

Figure 3:
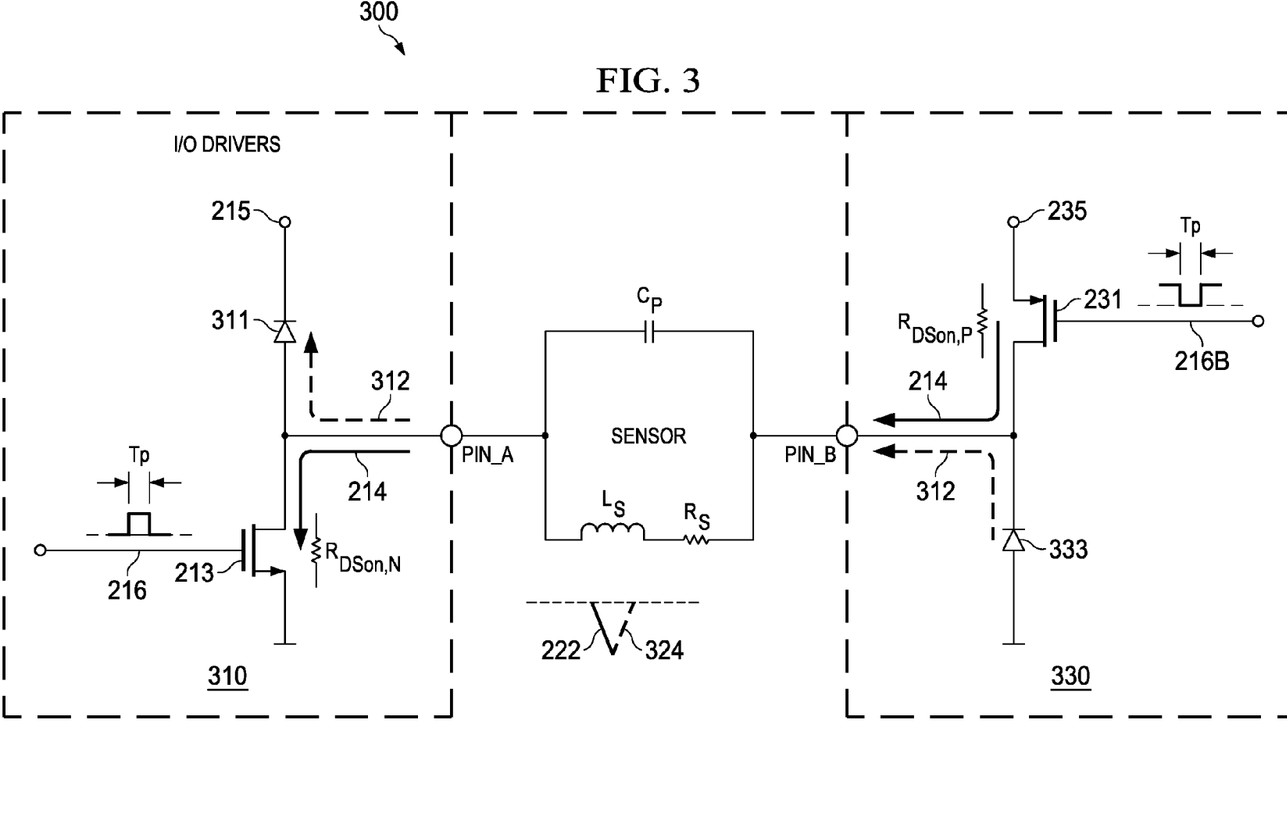

In another embodiment illustrated in FIG. 3, diodes are used for discharging the inductor. In this case the inductor forces the current through the diodes after turning off the switches. In this embodiment, the discharge period requires no time control. However, in typical CMOS (complimentary metal on silicon) devices, the voltage drop across a PMOS or NMOS switch device is lower than the voltage drop across a diode. Therefore, in this embodiment less energy can be recovered because of the loss across the two diodes.

Figure 4:
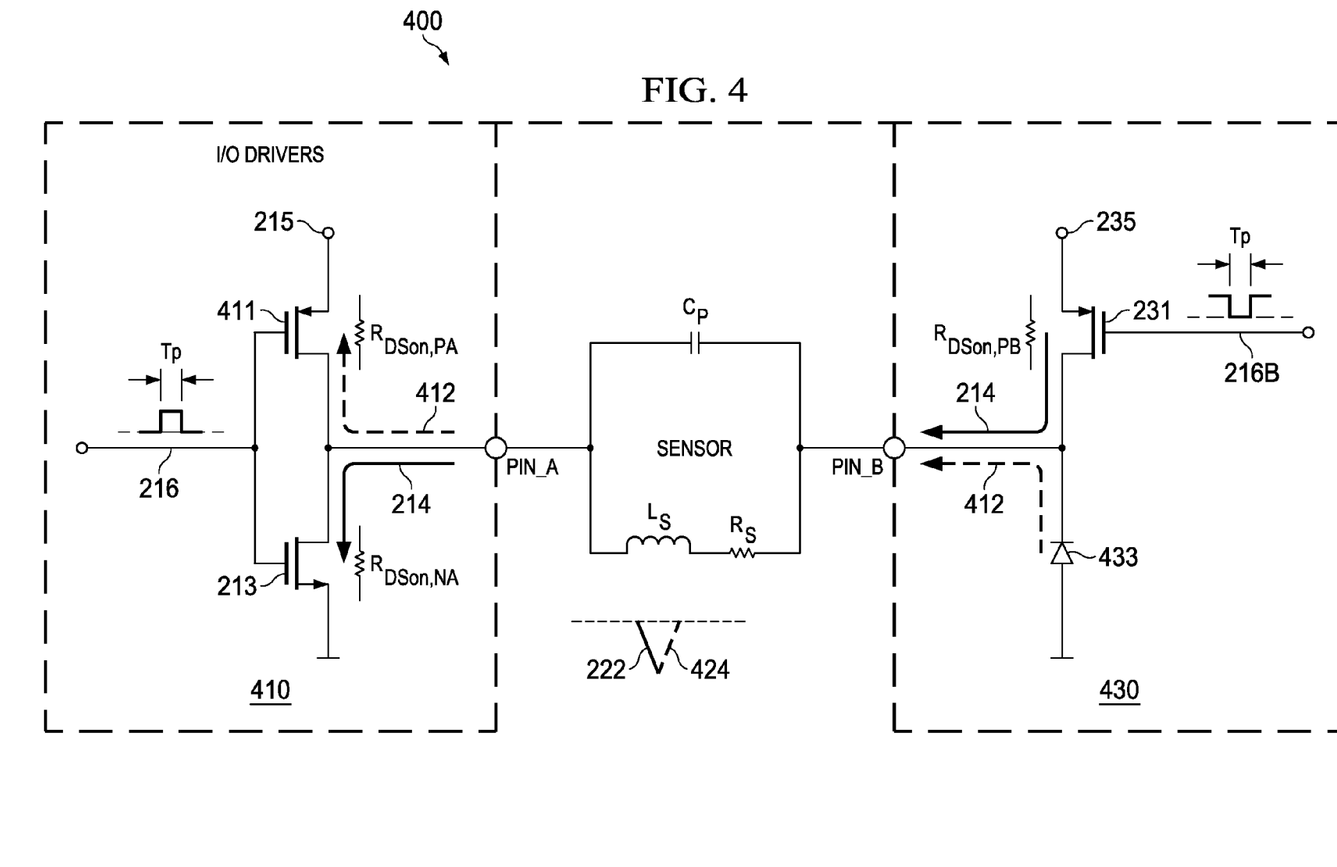
Figure 5:
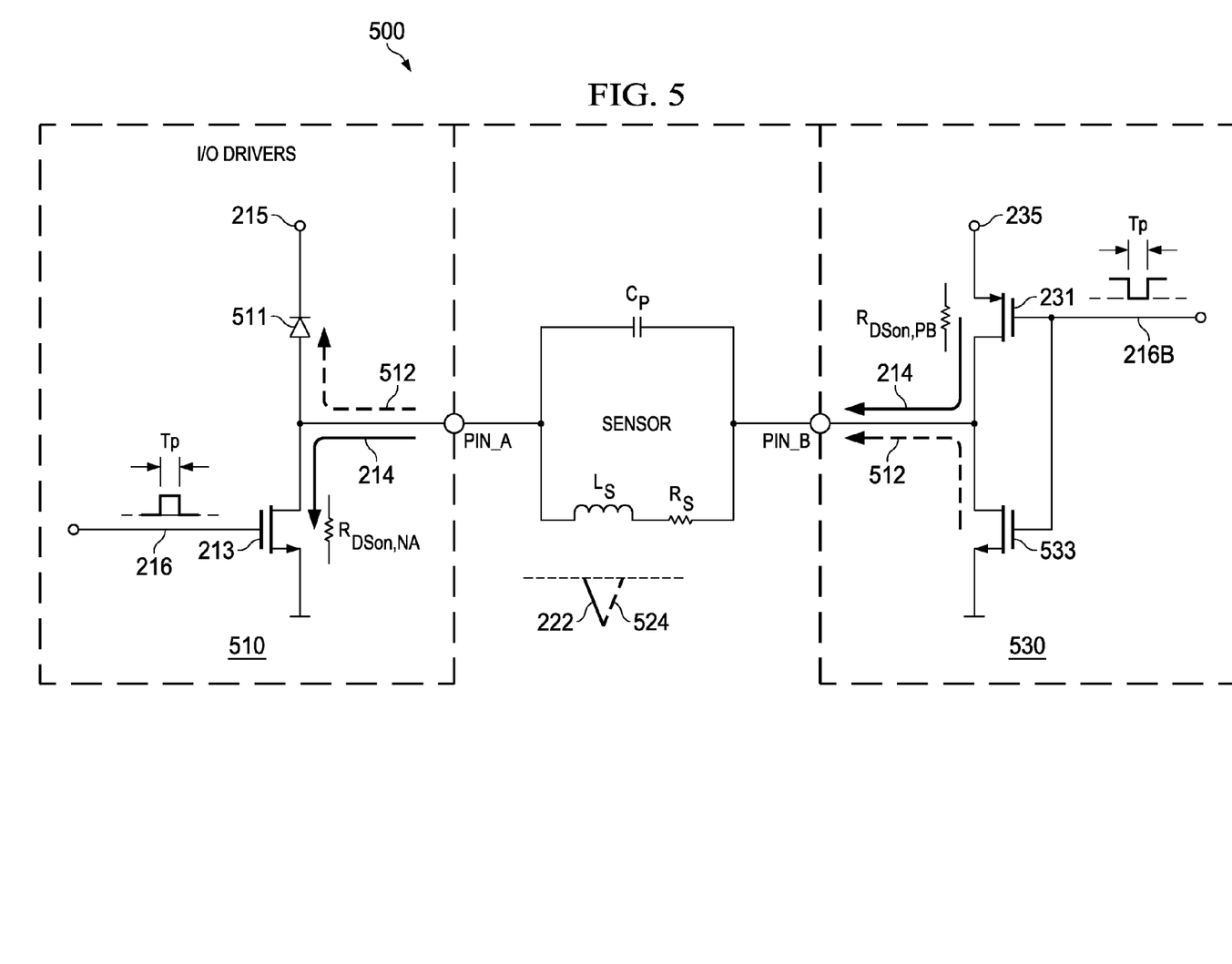

In a third embodiment illustrated in FIG. 4, a combination of switch and diode is used for discharge. This allows a larger part of the energy stored in the inductor to be recovered as compared to the embodiment of FIG. 3 since there is only one diode as compared to two diodes, while retaining the advantage of the embodiment of FIG. 3, in that no timing control for the discharge is required. A variation on this embodiment is illustrated in FIG. 5.

FIG. 2 shows an output driver configuration in a system 200 with the best efficiency to recover energy from inductive device Ls in sensor 120. The CMOS switch devices 211, 233 can be designed with a low on-resistance (Rdson). Assuming a battery voltage of approximately 1.5 volts, up to 80% of the energy can be recovered from inductive device in this embodiment. However, a part of this energy may be needed to generate a second pulse for the discharge phase on control signal 217. The timing of the second pulse on control signal 217 must be controlled closely which may cause an increase in the system complexity.

In this example, first driver 210 comprises a transistor 211 coupled between the voltage supply line 215 and output terminal 218; transistor 211 has a control terminal coupled to the second timing signal 217. Transistor 213 is coupled between the ground reference and output terminal 218; transistor 213 has a control terminal coupled to the first timing signal 216. Second driver 230 comprises a transistor 231 coupled between the voltage supply line 235 and the second output terminal 238; transistor 231 has a control terminal coupled to the first timing signal 216B. Timing signal 216B is just the inverse of timing signal 216. Transistor 233 is coupled between the ground reference and the output terminal 238; transistor 233 has a control terminal coupled to the second timing signal 217B. Timing signal 217B is just the inverse of timing signal 217.

During pulse Tp1 on timing control signal 216, the inductive device Ls in sensor 120 is charged through switch transistors 231 and 213 by current 214. As long as the length of timing pulse Tp1 is less than the time constant of Ls/Rs, current 214 will rise in a linear manner, as indicated at 222. During pulse Tp2 on timing control signal 217, inductor Ls is discharged through switch transistors 233 and 211 by current 212. The length of timing control signal pulse Tp2 must be controlled accurately to be long enough so that current 212 decays to a value of approximately zero, as indicated at 224, but short enough that current 212 does not reverse and begin to charge inductive device Ls.

During the discharge time period Tp2, inductor Ls is creating an inductive voltage that is somewhat higher than the battery voltage on supply terminal 215 and thereby causes current 212 to flow into supply voltage terminal 215. Current 212 may be returned to a battery that is providing the supply voltage on supply terminal 215, or be used to provide power to other circuits within system 200, for example.

FIG. 3 shows an output driver configuration in a system 300 that use two diodes 311, 333 in drivers 310, 330 to provide an energy recovery path for inductive device Ls. This embodiment has a lower energy recovery efficiency than the embodiment of FIG. 2 due to the inherent voltage drop across the diodes. In this embodiment, the battery voltage is approximately 1.5 volts; therefore only about 50% of the energy can be recovered. On the other hand, a second timing signal is not needed so there is no additional system complexity.

During pulse Tp on timing control signal 216, the inductive device Ls in sensor 120 is charged through switch transistors 231 and 213 by current 214. As long as the length of timing pulse Tp is less than the time constant of Ls/Rs, current 214 will rise in a linear manner, as indicated at 222. After timing pulse Tp is removed, inductor Ls is discharged through diodes 333 and 311 by current 312. Since the diodes prevent a reverse flow of current that would recharge the inductive device, as illustrated at 324, no additional timing signal is required.

During the discharge time period after Tp, inductor Ls is creating an inductive voltage that is somewhat higher than the battery voltage on supply terminal 215 and thereby causes current 312 to flow into supply voltage terminal 215. Current 312 may be returned to a battery that is providing the supply voltage on supply terminal 215, or be used to provide power to other circuits within system 300, for example.

FIG. 4 shows an output driver configuration in a system 400 with a good efficiency with no additional system complexity. This embodiment uses one switch device 411 in driver 410 and one diode 433 in second driver 430 to provide an energy recovery path for inductive device Ls. The CMOS switch device 411 can be designed with a low on-resistance (Rdson). This embodiment has a lower energy recovery efficiency than the embodiment of FIG. 2 due to the inherent voltage drop across diode 433, but a higher energy recovery efficiency than the embodiment of FIG. 3 since there is only one diode in the discharge path. In this embodiment, the supply voltage is approximately 1.5 volts; therefore about 60-70% of the energy can be recovered. On the other hand, a second timing signal is not needed so there is no additional system complexity.

During pulse Tp on timing control signal 216, the inductive device Ls in sensor 120 is charged through switch transistors 231 and 213 by current 214. As long as the length of timing pulse Tp is less than the time constant of Ls/Rs, current 214 will rise in a linear manner, as indicated at 222. After timing pulse Tp is removed, inductor Ls is discharged through diode 433 and switch device 411 by current 412. Since the diode prevents a reverse flow of current that would recharge the inductive device, as illustrated at 424, no additional timing signal is required.

During the discharge time period after Tp, inductor Ls creates an inductive voltage that is somewhat higher than the supply voltage on supply terminal 215 and thereby causes current 412 to flow into supply voltage terminal 215. Current 412 may be returned to a battery that is providing the supply voltage on supply terminal 215, or be used to provide power to other circuits within system 400, for example.

FIG. 5 shows an output driver configuration in a system 500 that is similar to FIG. 4 and also provides good efficiency with no additional system complexity. This embodiment uses one diode 511 in driver 510 and one switch device 533 in second driver 530 to provide an energy recovery path for inductive device Ls. The CMOS switch device 411 can be designed with a low on-resistance (Rdson). This embodiment has a lower energy recovery efficiency than the embodiment of FIG. 2 due to the inherent voltage drop across diode 511, but a higher energy recovery efficiency than the embodiment of FIG. 3 since there is only one diode in the discharge path. In this embodiment, the supply voltage is approximately 1.5 volts; therefore about 60-70% of the energy can be recovered. On the other hand, a second timing signal is not needed so there is no additional system complexity.

During pulse Tp on timing control signal 216, the inductive device Ls in sensor 120 is charged through switch transistors 231 and 213 by current 214. As long as the length of timing pulse Tp is less than the time constant of Ls/Rs, current 214 will rise in a linear manner, as indicated at 222. After timing pulse Tp is removed, inductor Ls is discharged through diode 511 and switch device 533 by current 512. Since the diode prevents a reverse flow of current that would recharge the inductive device, as illustrated at 524, no additional timing signal is required.

During the discharge time period after Tp, inductor Ls creates an inductive voltage that is somewhat higher than the battery voltage on supply terminal 215 and thereby causes current 512 to flow into supply voltage terminal 215. Current 512 may be returned to a battery that is providing the supply voltage on supply terminal 215, or be used to provide power to other circuits within system 500, for example Applications Any of the above embodiments may be used with a variety of sensor types. Flow rate sensors often produce rotary motion that can be sensed with an inductive sensor. Linear motion can also be measured using an inductive sensor.

An example FMP sensor is available from DIEHL that combines one primary inductor with four symmetrically arranged secondary inductors to sense flow rate in a pipe using rotary motion that is proportional to a rate of flow within the pipe, as described in more detail in U.S. Pat. No. 7,576,533. A rotor element has an asymmetric metallic element that is positioned adjacent the primary and secondary inductors. To do a measurement, a voltage step is provided to the primary inductor using the two drivers from any of the above embodiments as described in FIGS. 2-5. This voltage step causes a rising current in the primary and also in the secondary inductors that is influenced by the position of the metallic element. After a period of time Tp (pulse width), the voltage is removed which causes the current to decrease back to zero. As described above, a significant amount of energy may be recovered from the primary inductor. By monitoring the voltages induced in the four secondary inductors, the direction of rotation of the rotor may be determined and then used to infer the flow rate of the liquid or gas that is within the pipe.

For the calculation task it may be important that the current through the primary inductor rises in a linear manner. This may be achieved by keeping the pulse width Tp of the timing signal that controls the two drivers much smaller than the time constant Ls/Rdson, as described in more detail above.

Figure 6:
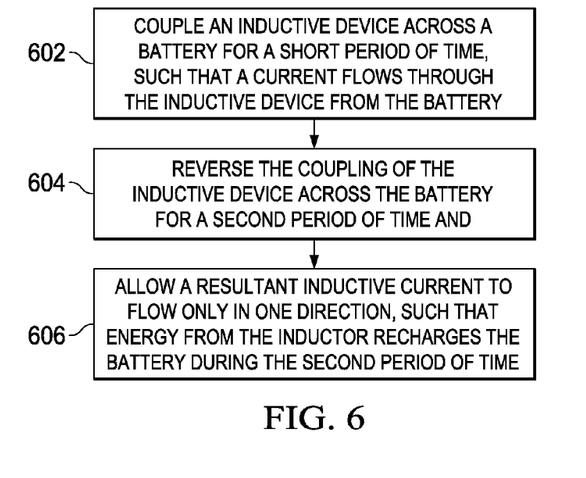
FIG. 6 is a flow diagram illustrating operation of energy recovery.

FIG. 6 is a flow diagram illustrating operation of energy recovery from an inductive sensor. An inductive device is coupled 602 across a battery for a short period of time, such that a current flows through the inductive device from the battery. This may be done by coupling a positive terminal of the battery to a first terminal of the inductive device in the sensor while coupling a negative terminal of the battery to a second terminal of the inductive device for a period of time.

The coupling of the inductive device across the battery is then reversed 604 for a second period of time. This may be done by coupling the first terminal of the inductive device to the negative terminal of the battery while coupling the second terminal to the inductive device to the positive terminal of the battery for the second period of time.

A resultant current is allowed 606 to flow only in one direction, such that energy from the inductor recharges the battery during the second period of time. This may be done by passing the resultant current through a diode to allow the resultant current to flow only in the direction of the positive terminal of the battery.

In another embodiment, allowing 606 current to flow in only one directions may be done by passing the resultant current through a switching device during the second period of time and opening the switching device after the second period of time in a manner that allows the resultant current to flow only in the direction of the positive terminal of the battery during the second period of time. The second period of time should be less than the discharge time of the inductive device so that current flow through the inductive device does not reverse before the end of the second time period.

Figure 7:
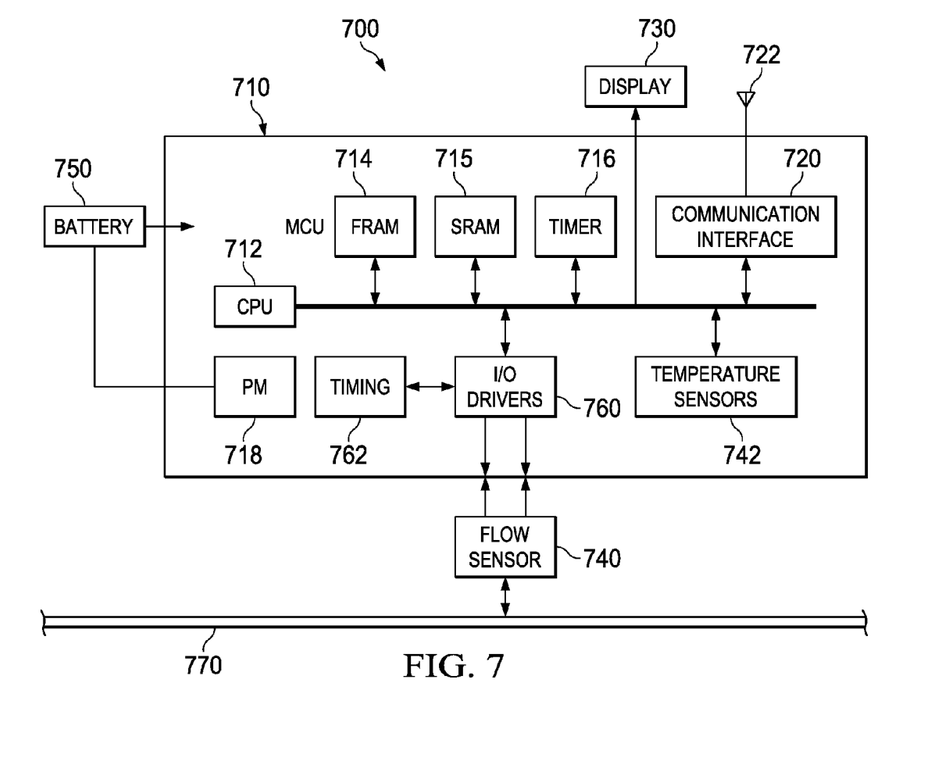
FIG. 7 is a block diagram of a remote sensor unit.

FIG. 7 is a block diagram of a remote sensor 700. Sensor 700 includes a microcontroller (MCU) 710 that may include an FRAM (ferroelectric random access memory) storage module 714, a static random access memory 715, and one or more timer modules 716. MCU 710 may also include various interfaces for coupling to a display 730, and one or more sensors 740, 742. In some embodiments, MCU 710 may also include a communications interface 720 to allow wireless reporting and/or communication with a data collection system.

MCU 710 may be embodied as an MSP430FR57xx available from Texas Instruments, for example. The Texas Instruments MSP430FR57xx family of ultralow-power microcontrollers includes multiple devices featuring embedded FRAM nonvolatile memory, ultralow power 16-bit MSP430 CPU, and different peripherals targeted for various applications. The architecture, FRAM, and peripherals, combined with several low-power modes, are optimized to achieve extended battery life in portable and wireless sensing applications. FRAM is a nonvolatile memory that combines the speed, flexibility, and endurance of SRAM with the non volatility of flash, all at lower total power consumption. Peripherals may include various subsystems, such as, for example: 10-bit ND converter, 16-channel comparator with voltage reference generation and hysteresis capabilities, serial channels capable of I2C, SPI, or UART protocols, internal DMA, hardware multiplier, real-time clock, 16-bit timers, etc.

Ferroelectric random access memory (FRAM) is a non-volatile memory technology with similar behavior to DRAM. Each individual bit can be accessed and unlike EEPROM or Flash, FRAM does not require a special sequence to write data nor does it require a charge pump to achieve the higher programming voltages. Because the speed of FRAM is equivalent to embedded Static RAM in many microcontrollers in addition to its dynamic accessibility and non-volatility, it is what is commonly referred to as a Universal Memory. This means it can function as the data memory or the program memory at any given time in its life.

In this example, FRAM 714 provides 16 kB of storage, SRAM 715 provides 1 KB of storage, CPU 712 is a 16-Bit RISC Architecture that operates at speeds up to 8-MHz. However, other embodiments may include other types of CPU and different memory capacities. Since the FRAM is non-volatile, an application program may be stored within FRAM 714 for execution by CPU 712. A portion of FRAM 714 may also be allocated for use as a data memory to store data that is collected from sensors 740, 742. Since FRAM does not have the write restrictions associated with Flash non-volatile memory, FRAM 714 may be used as a scratch pad memory during processing of the collected sensor data.

Communications interface 720 may include a transmitter and a receiver for wireless communication with an external data collection system. Interface 720 may communicate using RF standards such as ZigBee, which is popular in low data rate, low power applications. ZigBee and other low power RF standards use MAC and PHY layers defined by IEEE 802.15.4. An amendment to 802.15.4, called 802.15.4e uses a duty-cycled MAC to reduce radio power consumption. Interface 720 may be embodied as a CC3000-TiWI-SL module, available from Texas Instruments, for example.

Display 730 may be a simple set of LEDs (light emitting diodes), or a more complex LCD (liquid crystal display), for example. In some embodiments, display 730 may be omitted.

This example includes a flow sensor 740 for sensing water flow rates in a pipe 770 and temperature sensors 742 for sensing air temperature. However, various embodiments may include a wide range of known or later developed sensors that may be used to collect various types of environmental data. This example of MCU 710 includes a 700-ksps 10-bit ADC and 2 op-amps that may be used to gather and process environmental data from sensors 740, 742.

Battery 750 provides power to MCU 710, communication interface 720, display 730 and sensors 740, 742. Power management (PM) logic 718 may be included within MCU 710, or it may be separate. PM logic 718 may be configured to control power levels provided to MCU 710, communications interface 720, display 730, and sensors 740, 742. Various schemes for controlling and changing power consumption by various domains within an integrated circuit and multichip system that are now known or later developed may be used by PM 718. For example, this may include raising or lowering voltage levels provided by battery 750 to the various components. This may also include changing a clock rate provided to MCU 710.

I/O drivers 740 include one or more pairs of drivers as described in more detail with regards to FIGS. 2-5 for driving one or more sensors 740. Timing logic 762 may be configured by CPU 712 to generate timing pulses as described in more detail above to control the operation of drivers 760 so that energy used by an inductive device within sensor 740 may be recovered and returned to battery 750 or used in other circuitry within MPU 710.

Other Embodiments

While the invention has been described with reference to illustrative embodiments, this description is not intended to be construed in a limiting sense. Various other embodiments of the invention will be apparent to persons skilled in the art upon reference to this description. For example, while a liquid or gas flow meter was described herein, many other types of environmental data may be sensed, logged, and aggregated while a significant percentage of the energy used for each sample may be recovered as described herein.

In some embodiments the aggregated data may be transmitted in a power efficient manner using FRAM to store the logged data while the sensing node is placed in a low power idle state.

A sensing node may be implemented on a single integrated circuit as a system on a chip (SoC), or may be implemented in two or more integrated circuits that are coupled together by means of a substrate or by other coupling mechanisms, such as stacked packaging, etc.

A sensing node may include a user readable display. In another embodiment, no display is provided. A sensing node may include a user input mechanism, such as buttons, keypad, etc. In another embodiment, no user input mechanism is provided.

A wireless sensing node may be powered solely by a battery, or may include energy scavenging devices to augment or supplant the battery.

Remote wireless sensor networks may include sensor nodes spread out over a home, office building, or factory to help with energy management, comfort enhancement, security, diagnostics, and other applications.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the preceding discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection, for example. In the claims, coupling to a timing signal refers to either an asserted or an inverted version of the timing signal, as appropriate.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A system on chip (SoC) comprising:
a control circuit having an output for a first timing signal;
a first driver circuit having a first output terminal for coupling to a first terminal of an inductive device and an input coupled to receive the first timing signal, wherein the first driver circuit is configured to provide a low impedance from the first output terminal to a ground reference during a first time period and to provide a low impedance for current flowing from the first output terminal to a voltage supply line during a second time period; and
a second driver circuit having a second output terminal for coupling to a second terminal of the inductive device and an input coupled to receive the first timing signal, wherein the second driver circuit is configured to provide a low impedance from the voltage supply line to the second output terminal during the first time period and to provide a low impedance for current flowing from the ground reference to the second output terminal during the second time period;
wherein the first driver circuit comprises a first transistor coupled between the voltage supply line and the first output terminal, the first transistor having a control terminal coupled to the first timing signal; and a second transistor coupled between the ground reference and the first output terminal, the second transistor having a control terminal coupled to the first timing signal; and
wherein the second driver circuit comprises a third transistor coupled between the voltage supply line and the second output terminal, the third transistor having a control terminal coupled to the first timing signal; and a diode coupled between the ground reference and the second output terminal.

2. A system on chip (SoC) comprising:
a control circuit having an output for a first timing signal;
a first driver circuit having a first output terminal for coupling to a first terminal of an inductive device and an input coupled to receive the first timing signal, wherein the first driver circuit is configured to provide a low impedance from the first output terminal to a ground reference during a first time period and to provide a low impedance for current flowing from the first output terminal to a voltage supply line during a second time period; and
a second driver circuit having a second output terminal for coupling to a second terminal of the inductive device and an input coupled to receive the first timing signal, wherein the second driver circuit is configured to provide a low impedance from the voltage supply line to the second output terminal during the first time period and to provide a low impedance for current flowing from the ground reference to the second output terminal during the second time period;
wherein the first driver circuit comprises a diode coupled between the voltage supply line and the first output terminal; and a first transistor coupled between the ground reference and the first output terminal, the first transistor having a control terminal coupled to the first timing signal; and
wherein the second driver circuit comprises a second transistor coupled between the voltage supply line and the second output terminal, the second transistor having a control terminal coupled to the first timing signal; and a third transistor coupled between the ground reference and the second output terminal, the third transistor having a control terminal coupled to the first timing signal.

* * * * *